(12) United States Patent
Chen et al.

(10) Patent No.: US 8,686,492 B2
(45) Date of Patent: Apr. 1, 2014

(54) NON-VOLATILE FINFET MEMORY DEVICE AND MANUFACTURING METHOD THEREOF

(75) Inventors: Chun Chen, San Jose, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 469 days.

(21) Appl. No.: 12/722,083

(22) Filed: Mar. 11, 2010

(65) Prior Publication Data

US 2011/0220981 A1 Sep. 15, 2011

(51) Int. Cl.
*H01L 29/78* (2006.01)
*H01L 29/788* (2006.01)
*H01L 29/792* (2006.01)

(52) U.S. Cl.
USPC ...... 257/329; 257/330; 257/397; 257/E29.26; 257/E29.257; 438/259; 438/270

(58) Field of Classification Search
USPC ............... 257/302, 329–330, 332, 374, 397, 257/E27.096, E29.313, E29.274, E29.262, 257/E29.257, E29.26, E29.318, E29.321, 257/E21.41; 438/242–245, 248, 259, 270, 438/360–361, 386–389, 391, 424, 426–427, 438/429–430, 435, 444–445, 700–702
See application file for complete search history.

(56) References Cited

U.S. PATENT DOCUMENTS

| | | | | |
|---|---|---|---|---|
| 5,804,851 A | * | 9/1998 | Noguchi et al. | 257/304 |
| 6,057,580 A | * | 5/2000 | Watanabe et al. | 257/396 |
| 6,620,681 B1 | * | 9/2003 | Kim et al. | 438/257 |
| 7,309,634 B2 | * | 12/2007 | Hong | 438/288 |
| 7,371,654 B2 | * | 5/2008 | Sato et al. | 438/424 |
| 7,382,015 B2 | * | 6/2008 | Iguchi et al. | 257/315 |
| 7,521,320 B2 | * | 4/2009 | Dong | 438/257 |
| 7,915,138 B2 | * | 3/2011 | Cho et al. | 438/435 |
| 7,935,608 B2 | * | 5/2011 | Heinrichsdorff et al. | 438/424 |
| 7,999,328 B2 | * | 8/2011 | Sandhu et al. | 257/374 |
| 8,163,610 B2 | * | 4/2012 | Aritome | 438/211 |
| 2004/0102005 A1 | * | 5/2004 | Dong et al. | 438/257 |
| 2006/0128099 A1 | * | 6/2006 | Kim et al. | 438/258 |
| 2006/0141706 A1 | * | 6/2006 | Hong | 438/257 |
| 2007/0102752 A1 | * | 5/2007 | Kim | 257/316 |
| 2008/0029804 A1 | * | 2/2008 | Dong | 257/315 |
| 2009/0029512 A1 | * | 1/2009 | Willer et al. | 438/261 |
| 2009/0200603 A1 | * | 8/2009 | Ogura et al. | 257/326 |
| 2010/0219465 A1 | * | 9/2010 | Tanaka et al. | 257/329 |
| 2011/0062509 A1 | * | 3/2011 | Kato et al. | 257/324 |
| 2011/0092039 A1 | * | 4/2011 | Kim et al. | 438/270 |
| 2012/0193703 A1 | * | 8/2012 | Zahurak et al. | 257/329 |

* cited by examiner

*Primary Examiner* — Laura M Menz
*Assistant Examiner* — Maliheh Malek
(74) *Attorney, Agent, or Firm* — Sterne, Kessler, Goldstein & Fox P.L.L.C.

(57) ABSTRACT

Methods for fabricating an electronic device and electronic devices therefrom are provided. A method includes forming one or more masking layers on a semiconducting surface of a substrate and forming a plurality of dielectric isolation features and a plurality of fin-type projections using the masking layer. The method also includes processing the masking layers and the plurality of fin-type projections to provide an inverted T-shaped cross-section for the plurality of fin-type projections that includes a distal extension portion and a proximal base portion. The method further includes forming a plurality of bottom gate layers on the distal extension portion and forming a plurality of control gate layers on the plurality of dielectric isolation features and the plurality of bottom gate layers.

10 Claims, 7 Drawing Sheets

NON-VOLATILE FINFET MEMORY DEVICE AND MANUFACTURING METHOD THEREOF

BACKGROUND OF THE INVENTION

1. Statement of the Technical Field

The invention is directed to the field of memory devices in electronic systems, and more particularly, to non-volatile memory devices in electronic systems.

2. Description of the Related Art

The need to retain cost and performance competitiveness in the production of metal-oxide-semiconductor field effect transistor (MOSFET) devices, and particularly MOSFET-based memory devices, has driven the increase in device density in integrated circuits. As a result, new technologies are constantly needed to order to allow the feature size of these devices to be reduced and therefore allow the device density to be increased. This is generally referred to as device "scaling". Unfortunately, as non-volatile MOSFET-based memory devices are scaled, such devices suffer from several problems. In particular, interactions between the channel and source/drains of these devices may degrade the ability of the gate of the same to control whether the device is on or off. This phenomenon is generally referred to as "short-channel effects". Further, the reduction of design features makes it difficult for such memory device to meet data retention requirement, e.g., a ten year data retention requirement.

One proposed solution for addressing the above-mentioned issues with non-volatile MOSFET-based memory device is the use of FINFET structures. That is, rather that using the conventional horizontal arrangement for a channel in a non-volatile MOSFET-based memory device, the channel is instead formed by providing a vertical semiconductor or "fin". As a result, the gate electrode effectively surrounds the channel and every region of the channel is influenced by the gate electrode. Therefore, because charge flow can be more effectively inhibited between a source and a drain when the transistor is turned off, it may be possible to reduce power consumption. Additionally, since a portion of the channel is vertically oriented, a FINFET non-volatile memory cell can be formed with a foot print of a smaller, horizontal device. However, the increased channel length provided by the vertical fin allows the reduced size FINFET memory cell to retain the data retention characteristics of larger devices.

BRIEF DESCRIPTION OF THE DRAWINGS

Non-limiting and non-exhaustive embodiments of the invention are described with reference to the following drawings, in which.

DETAILED DESCRIPTION

The invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the invention are related to methods for manufacturing electronic systems including memory cell devices and systems thereof. As described above, one method of providing high density non-volatile memory arrays that are not significantly affected by short channel effects and that provide acceptable data retention times is the use of FINFET memory cells. However, one major difficultly arising in conventional non-volatile FINFET memory cells is excessive control gate leakage current.

In general, a conventional FINFET memory cell process consists of a shallow trench isolation (STI) process to form semiconductor projections in the substrate (to define FINFET active areas) and trenches therebetween (for forming dielectric isolation regions). Such processes also include an oxide recess process to expose a portion to the resulting FINFET active areas after STI oxide deposition and polish. Thereafter, deposition and patterning of a tunnel oxide and a charge trapping layer exposed portions of the FINFET active areas performed, followed by deposition and patterning of gate dielectric and gate electrode layers to form memory array lines. In such a process, excessive control gate leakage currents are generally an artifact of the processing required for forming the charge trapping layer for each FINFET memory cell in the array. As described above, the charge trapping layer is typically deposited, not grown, during a conventional FINFET process. Thus, portions of the charge trapping layer are formed over the tunnel oxide layer and over portions of the dielectric isolation regions separating the FINFET active areas. To provide proper isolation for the charge trapping layer between memory cells, at least a portion of this layer over the dielectric isolation regions is typically removed. However, conventional etch processes for the charge trapping layer typically include an over-etch step to ensure complete removal of the charge trapping layer in such areas. In the case of conventional silicon-based NAND-type memory arrays, such over-etching generally also results in a portion of the dielectric isolation regions between the FINFET active regions also being removed. Consequently, a portion of the control gate electrode layer will typically extend into this etched portion of the dielectric isolation regions, to forming an extrusion region of the control gate electrode layer.

The resulting extrusion region causes a MOS device to be formed that can cause current leakage in the FINFET memory cell. First, leakage current may result during erase operations. In particular, when a positive voltage is applied to the cell body (i.e., the substrate) and/or a negative voltage is applied to the control gate electrode layer during an erase operation, the absence of the tunnel oxide, charge trapping, and control gate dielectric layers in the extrusion portion permits electrons to be injected from the control gate electrode layer 118 into the channel of the memory cells. These injected electrons thus result in a leakage current for the memory cells. Second, reliability of the memory cells may be affected. In particular, the leakage current can generate trapped charges in the dielectric isolation regions near the channel of the FINFET memory cells, affecting reliability of the cell. In particular, a shift of the threshold voltage of the memory cells can occur. Further, as the thickness of the charge trapping layer is reduced, leakage current and reliability issues can be further exacerbated.

Figure 1:
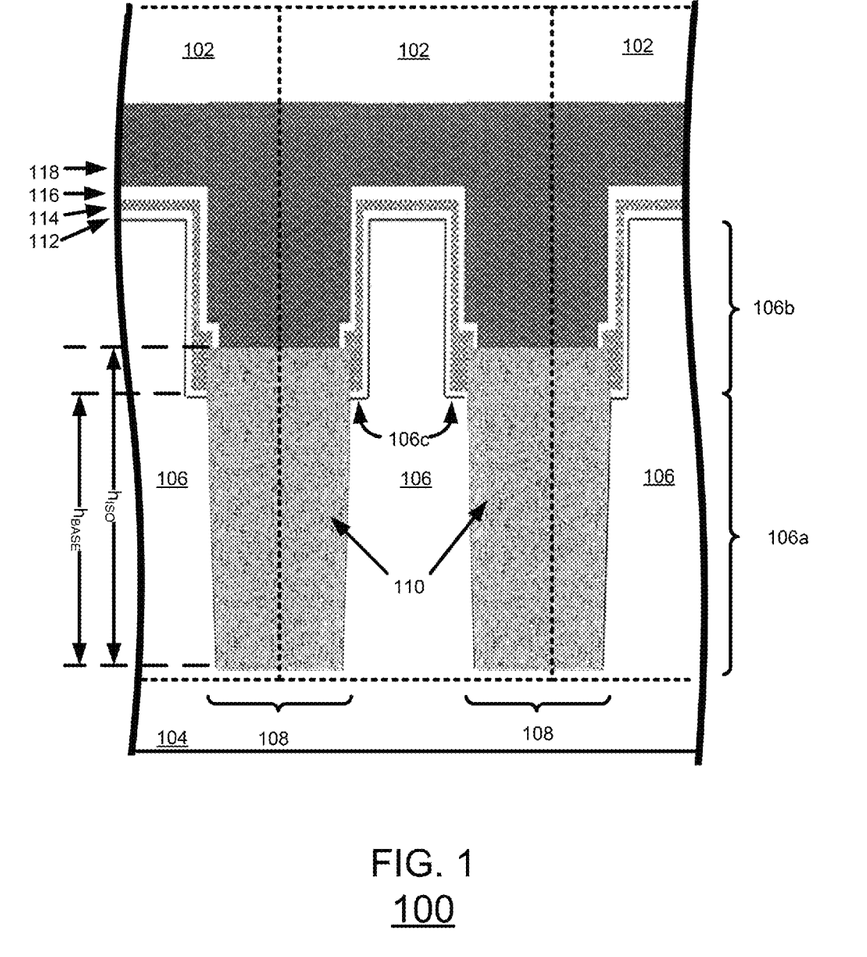
FIG. 1 is a cross-section view of a portion of a NAND-type FINFET memory array in accordance with an embodiment of the invention.

To overcome the limitations of conventional FINFET memory cells, the various embodiments of the invention provide a new FINFET memory cell in which the control gate leakage is significantly reduced or eliminated by reducing or eliminating the extrusion portion of the control gate electrode layer. This is shown in FIG. 1. FIG. 1 is a cross-section view of a portion of a NAND-type FINFET memory array 100 in accordance with an embodiment of the invention. As shown in FIG. 1, memory array 100 includes a plurality of memory cells 102 formed on a substrate 104. The memory cells 102 are formed by a series of fin-type projections 106 vertically extending from the substrate 104 and laterally coextending along the surface of the substrate 104. The term "coextending", as used herein, refers to objects of features that extend parallel or substantially parallel (±20 degrees difference) to each other. The term "fin-type", as used herein, refers to objects having a width that is less than a height of the object and less than a length of the object. The projections 106 thus define a series of trenches 108. To provide isolation between the active areas of the projections 106, dielectric isolation regions 110 are provided in portions of the trenches 108.

In the various embodiments of the invention, a cross-section for fin-type projections 106 is an inverted T-shaped widthwise cross-section. As used herein, the term "inverted T-shape", as used with respect to a feature, refers to a feature having a lower or base portion and an upper or extension portion in which the average width of the base portion is greater than an average width of the extension portion. Thus, projections 106 are configured to include a proximal (with respect to substrate 104) base portion 106a extending from substrate and a distal (with respect to substrate 104) extension portion 106b extending from the proximal base portion 106a.

In memory array 100, the dielectric isolation features 110 are configured to have a height ($h_{ISO}$) greater than a height ($h_{BASE}$) of the proximal base portions 106a. However, the dielectric isolation features 110 are not in contact with the sidewalls of the distal extension portion 106b. Rather, the sidewalls of the distal extension portion 106b are separated from the dielectric isolation regions by a tunnel oxide layer 112 and a charge trapping layer 114 formed on the distal extension portion 106b and the top surface 106c of proximal base portion 106a. Finally, a control gate dielectric layer 116 and a control gate electrode layer 118 are disposed over the memory cells 102 and patterned to define the word line patterns for the memory array 100.

As a result of the configuration of FIG. 1, the control gate electrode layer 118 is separated from the channel portion of projections 106 (i.e., distal portion 106b) by at least some portion of both layers 112 and 114. Thus, the likelihood of a substantial amount of leakage current memory cell 102 due to injection of charges via the dielectric isolation regions 110 is significantly reduced. Further, since the amount of leakage currents will be reduced, the likelihood of a threshold voltage shift is also reduced, resulting in improved reliability for memory cells 102.

Figure 2:
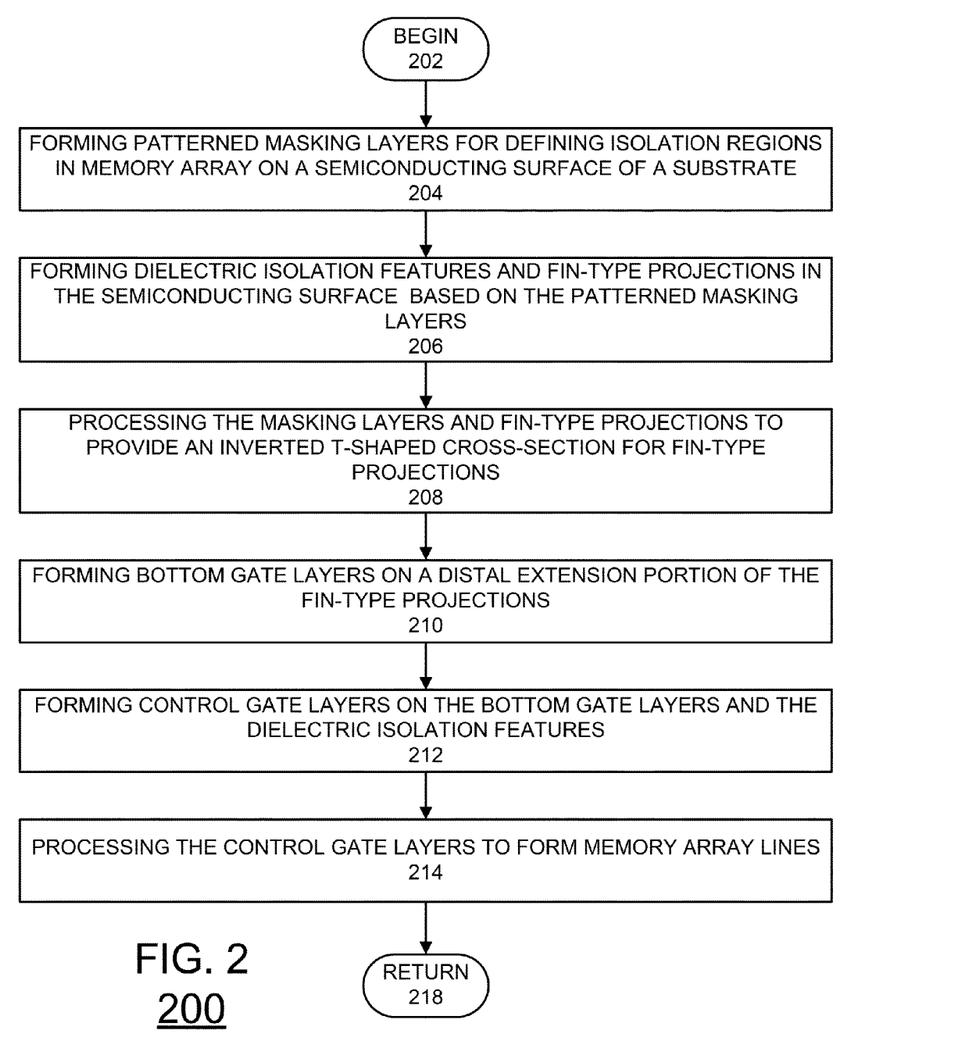
FIG. 2 is a flowchart of steps in an exemplary method for fabricating a NAND-type FINFET memory array in accordance with an embodiment of the invention.

In the various embodiments of the invention, the structure in FIG. 1 can be formed by modifying the formation of the dielectric isolation features 110 and the projections 106. An exemplary process is described below with respect to FIG. 2 and FIGS. 3A-3H. FIG. 2 is a flowchart of steps in an exemplary method 200 for fabricating the NAND-type FINFET memory array in FIG. 1 in accordance with an embodiment of the invention. FIGS. 3A-3H are cross-section view of a portion of the NAND-type FINFET memory array in FIG. 1 at various points of the flowchart in FIG. 2.

Method 200 begins at block 202 and proceeds to block 204. At block 204, one or more patterned masking layers can be formed on a semiconductor surface of a wafer to define isolation regions for at least the memory array. For example in the case of a substrate having a silicon surface, the masking layers can comprise a silicon oxide ($Si_xO_{1-x}$) comprising layer formed on the silicon surface and a silicon nitride ($Si_yN_{1-y}$) comprising layer formed on the silicon oxide comprising layer. The masking patterned layers can be formed in a variety of ways. For example, in some embodiments of the invention, photolithographic processes can be used to form a patterned layer of photoresist for defining the pattern for the masking layers. As used herein, photolithographic processes can include one or more steps for forming patterns in photosensitive material. These steps can include wafer cleaning, barrier layer formation, photoresist application, soft baking, mask alignment, exposure and development, and hard-baking. However, the various embodiments of the invention are not limited in this regard and other photolithographic processes can include more or less steps than those listed above.

Figure 3A:
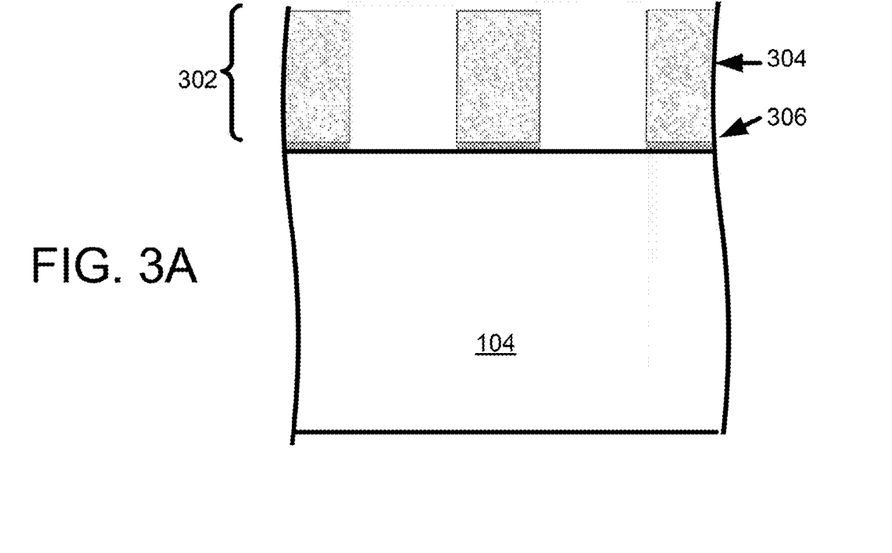
FIGS. 3A-3H are cross-section view of a portion of a NAND-type FINFET memory array at various points of the flowchart in FIG. 2.

Once the photoresist is patterned to expose one or more portions of the masking layers, an etch process or other removal process can be used to transfer the pattern of the photoresist layer into the masking layers. In the various embodiments of the invention, dry etch processes, wet etch processes, or any combination thereof can be used to transfer the photoresist pattern into the masking layers and expose the semiconductor substrate underneath. Such etch processes can also one or more dry and/or wet cleaning steps before or after the removal of material. The result of this process is illustrated in FIG. 3A. As shown therein, patterned masking layers 302 are formed on substrate 104. In the exemplary embodiment illustrated in FIG. 3A, the masking layers 302 include a silicon oxide layer 306 formed on the silicon surface 104 and a silicon nitride layer 304 formed on the silicon oxide 306 layer. In some embodiments of the invention, the nitride layer 304 can have at least a residual layer of photoresist remaining thereon.

Figure 3B:
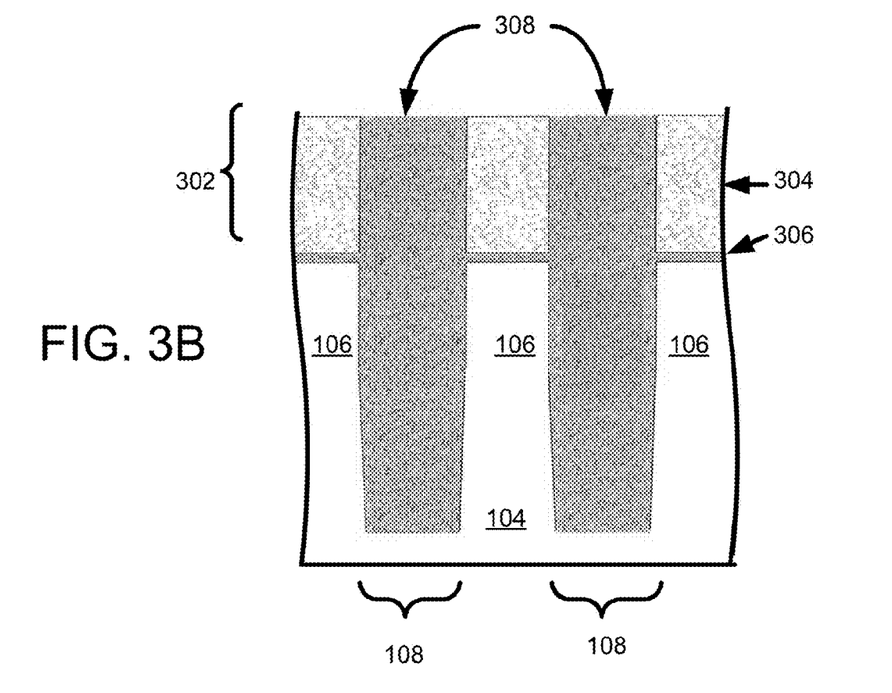

Once the patterned masking layers are patterned at block 204, dielectric isolation features can be formed at block 206 using the patterned masking layer. In some embodiments of the invention, the patterned masking layers formed at block 204 can be used in shallow trench isolation (STI) processes to form isolation regions. The result of this process is shown in FIG. 3B. In an STI process, the pattern masking layers 302 are used as an etch mask for etching trenches 108 into substrate 104. In such processes, an etch process that is selective to the substrate material can be used to etch trenches 108 without significantly affecting the dimensions of the patterned masking layer. Further, the etch process can be anisotropic to prevent the width dimensions of the trenches 108 from varying significantly form the width dimensions defined by the patterned masking layers 302. In the various embodiments of the invention, dry etch processes, wet etch processes, or any combination thereof can be used to transfer the pattern in the patterned masking layers into the substrate 104 to define trenches 108 and form projections 106. Once the trenches 108 are defined, an isolation dielectric material 308 can be formed on substrate 104 to fill trenches 108 and to cover the patterned masking layers 302. Thereafter, a planarization process, such as a mechanical polishing and/or chemical mechanical polishing (CMP) process can be used to remove excess isolation dielectric material to provide the structure shown in FIG. 3B. In such embodiments, the polishing process can be configured to stop on nitride layer 304 and thus prevent further removal of dielectric isolation material 308 between portions of masking layer 302.

In other embodiments of the invention, a local oxidation of silicon (LOCOS) process can be used to form dielectric isolation materials 308. In such a process, rather than using patterned masking layers 302 as a mask for an etch process, the patterned masking layers 302 can be used to define areas for silicon oxide growth. Thus, a dielectric isolation material can be formed in the exposed portions of substrate 104 using a wet or dry oxidation process. As a result, the silicon oxide growth process concurrently defines the dielectric isolation materials 308 and the projections 106 without the need to form trenches 108.

Figure 3C:
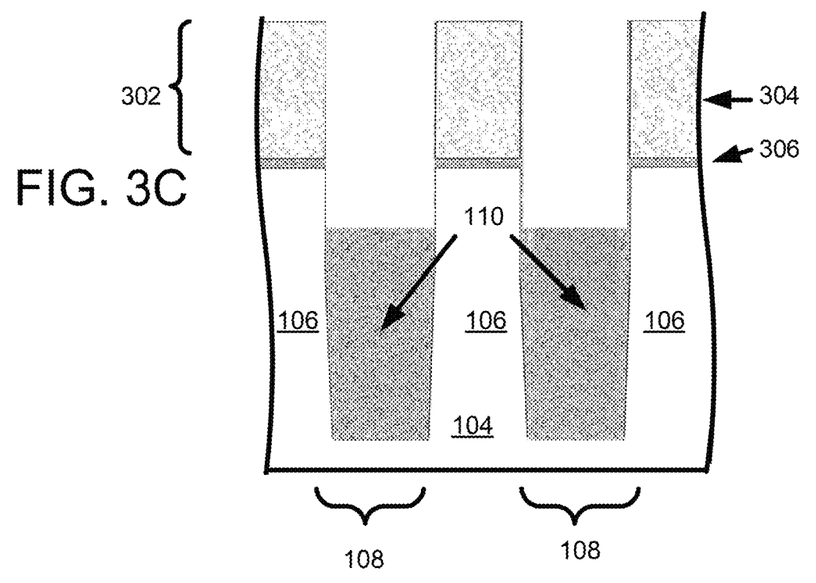

Thereafter, a etch or other removal process can be used to reduce the height of dielectric isolation materials 308 to form dielectric isolation regions 110, as shown in FIG. 3C. In such processes, an etch process is used that is selective to the isolation dielectric material 308 without significantly affecting the dimensions of the patterned masking layer. In the various embodiments of the invention, dry etch processes, wet etch processes, or any combination thereof can be used to etch dielectric isolation materials 308.

Figure 3D:
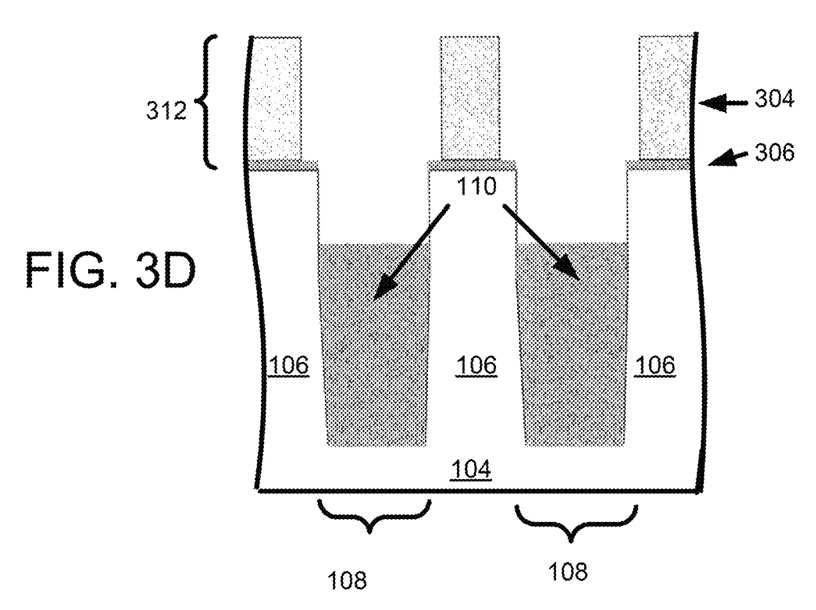
Figure 3E:
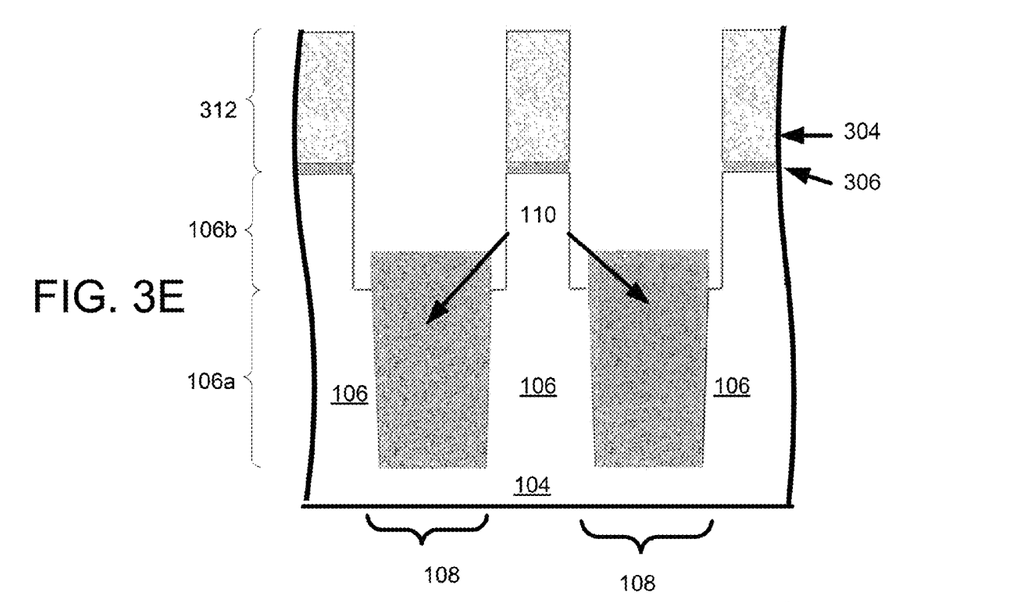

In a conventional process, once the dielectric isolation regions and the trenches are formed, the process would proceed with formation of the gate layers to form the FINFET memory cells. However, as described above, such a process leads to leakage currents and other problems for FINFET memory cells. Accordingly, in the various embodiments of invention, additional steps are included in the process flow. In particular, at block 208, the masking layers and the projections are processed to provide an inverted T-shape cross-section for the projections defining the FINFET active areas. This is illustrated in FIGS. 3D and 3E.

First, a width of at least a portion of the masking layers is reduced. In the exemplary embodiment illustrated in FIG. 3D, the width of the nitride layer 304 of masking layers 302 is reduced relative to the width of projections 106. In some embodiments, the width of oxide layer 306 can also be reduced, depending on the thickness of layer 306 and the type of etch(es) to be subsequently used for etching projections 106. Such a reduction can be achieved using photolithographic processes to define portions of masking layers 302 to be removed, followed by an etch of removal process selective to the portions of layer 302 to be removed. Such an etch process can be an anisotropic etch process in order to control the final width of layer 306. In other embodiments, the reduction can be achieved without providing a photoresist layer. In particular, the masking layers 302 can be exposed to an isotropic etch to cause the desired reduction in width. As a result, a second set of patterned masking layers 312 is effectively formed, defining a pattern for further etching of projections 106.

Once the second set of masking layers 312 is formed, the pattern defined therein can be transferred onto a portion of projections 106 to define distal portion 106b and proximal base portion 106a of projections 106. In particular, an etch process is used that is selective to the semiconductor material of the projections 106 without significantly affecting the dimensions of the second set of patterned masking layers 312 or dielectric isolation regions 310. In the various embodiments of the invention, dry etch processes, wet etch processes, or any combination thereof can be used to etch projections 106. As a result of the etch process, distal portions 106b and proximal portions 106a of projections 106 are formed, as shown in FIG. 3E. Further, the etch process defines distal portions 106b so that a height of dielectric isolation regions 110 is greater than a height of proximal portions 106a, as described above with respect to FIG. 1.

Figure 3F:
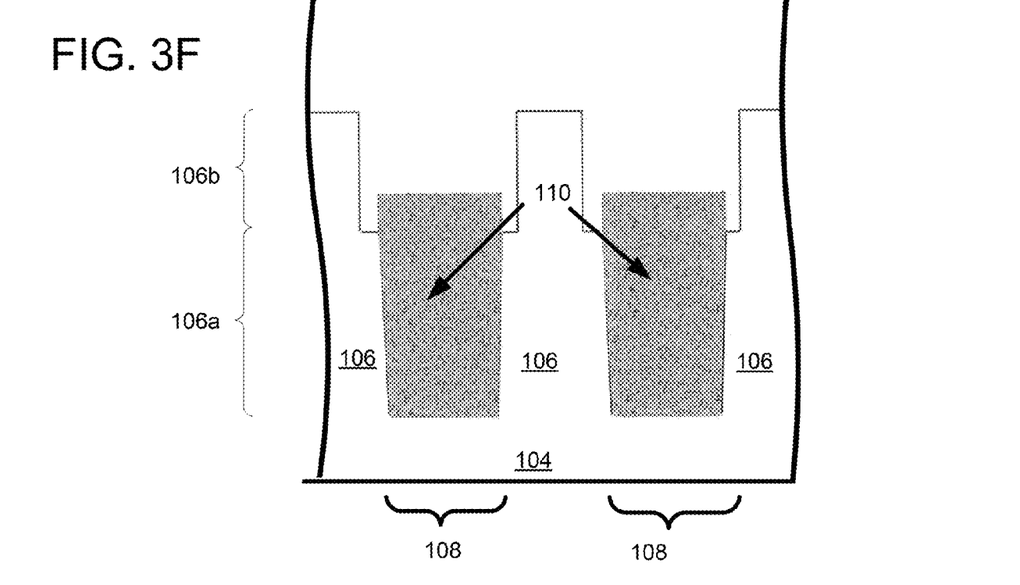
Figure 3G:
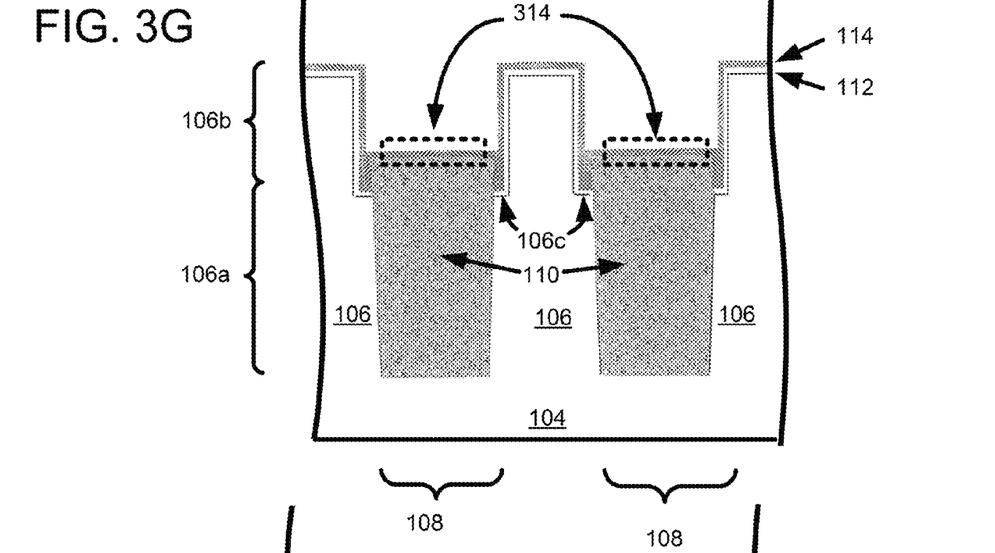

Once the projections 106 are processed to provide an inverted T-shaped structure at block 208, the fabrication of the memory cells can be completed in blocks 210-214. First, bottom gate layers for the memory cells can be formed at block 210. In such a process, any remaining portions of layers 304 and 306 can also be removed, as shown in FIG. 3F. Thereafter, a tunnel oxide layer 112 can be formed over the exposed portions of projections 106. In particular, as shown in FIG. 3G, tunnel oxide layer 112 is formed over the surfaces of distal portion 106b and on the top surfaces 106c of proximal base portion 106b. Thereafter, the charge trapping layer 114 is deposited on substrate 104. As a result, charge trapping layer extends over tunnel oxide layer 112 and over the exposed portions of dielectric isolation regions 110, as shown in FIG. 3G. Finally, the formation of the bottom gate layers is completed by removal of the portions 314 of charge trapping layer 114 on the dielectric isolation regions 110, resulting in the structure illustrated in FIG. 3H.

Figure 3H:
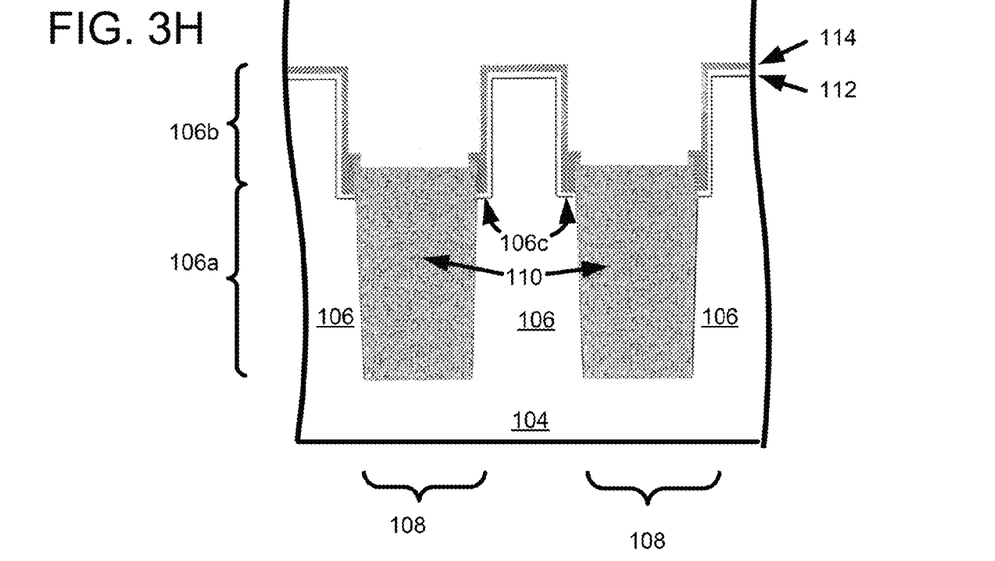

In the various embodiments of the invention, the charge trapping layer 114 on the dielectric isolation regions 110 can be removed using a combination of photolithographic and etch processes. In particular, a masking pattern can be defined for removing only a portion of charge trapping layer 114 in dielectric isolation regions 110. In some cases, as shown in FIG. 3H, the etch process can result in the removal of some portion of the dielectric isolation regions 110. However, in such processes, the initial height of the dielectric isolation regions 110 is selected such the final height is still greater than the height of proximal base regions 106b. As a result, and extrusion portions of any control gate electrode layer subsequently formed are separated from the distal extension portions 106b by at least a portion of layers 112 and 114.

After the bottom gate layers are formed in block 210, top gate layers for the memory cell 100 can be formed at block 212. In particular, a control gate dielectric layer 116 can be formed on at least charge trapping layer 114 using a growth or deposition method. Thereafter, a control gate electrode layer 118 can be formed on the control gate dielectric layer 116. Subsequently at block 214, the control gate layers can be processed to form memory array lines. For example, a combination of photolithographic and etch processes can be used to remove portions of the control gate layers. As a result, the structure shown in FIG. 1 is provided. Afterwards, method 200 proceeds to block 218 to resume additional processing of substrate, including the formation of other layers and/or processing of other portions of substrate 104 outside memory array 100.

Figure 4:
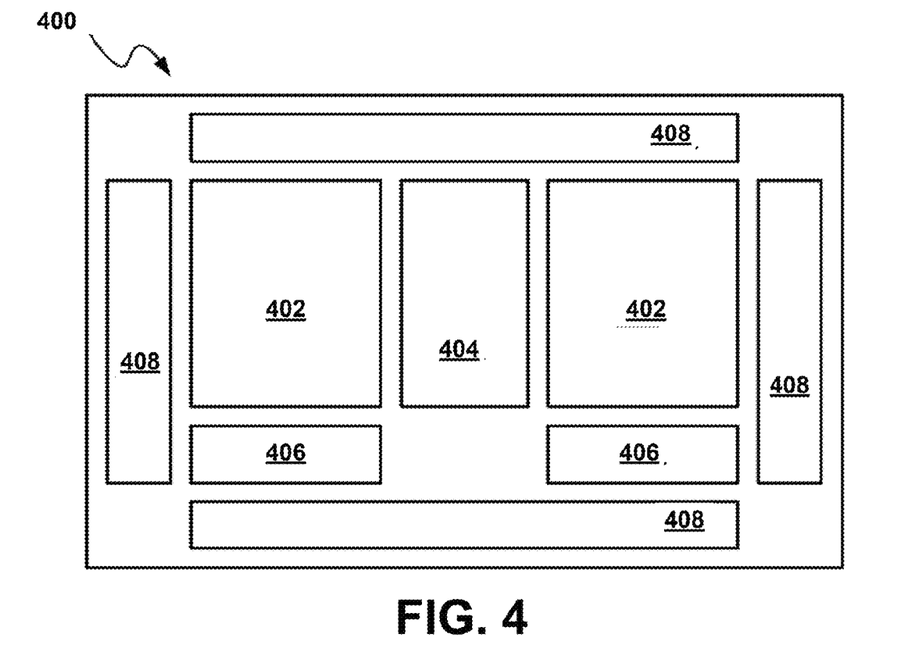
FIG. 4 is a plan view of an electronic device in accordance with an embodiment of the invention.

Referring now to FIG. 4, therein is shown a plan view of a device 400 in accordance with an embodiment of the invention. The device 400 is an electronic device including one or more memory system cell systems 402 and other components 404-408. The various components of device 400 can be formed on a same substrate or housing. However the various embodiments of the invention are not limited in this regard.

The memory cell systems 402 can include individually addressable, substantially identical memory arrays, such as memory array 100 of FIG. 1. The other components 404-408 can include input/output (I/O) circuitry and programming circuitry for individually and selectively addressing the memory cell system 402. For example, the programming circuitry can include one or more x-decoders 404 and y-decoders 406, cooperating with I/O circuitry 408 for connecting to memory cells and effecting designated operations on the memory cells. For example, such operations can include programming, reading, and erasing, and deriving necessary voltages to effect such operations.

For illustrative purposes, the device 400 is shown as a memory device, although it is understood that the device 400 may other semiconductor devices having other functional blocks, such as a digital logic block, a processor, or other types of memories. In some embodiments of the invention, the device 400 can be as single semiconductor device. However, the invention is not limited in this regard. For example, in other embodiments of the invention, the device 400 can be a multichip module with other types of devices of similar or different semiconductor technologies, such as power devices or microelectromechanical systems (MEMS). In yet other embodiments of the invention, the device 400 may be a board level (i.e., formed on a printed circuit board) electronic device including a memory array in accordance with the various embodiments of the invention.

Figure 5:
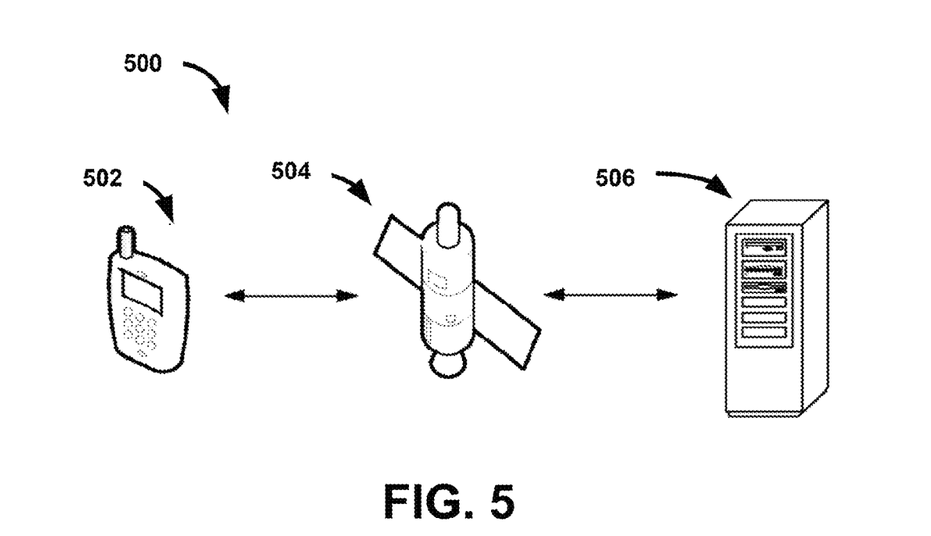
FIG. 5 shows an exemplary electronic system in accordance with an embodiment of the invention.

Referring now to FIG. 5, therein is shown an exemplary electronic system 500 in accordance with an embodiment of the invention. A mobile or non-mobile terrestrial based communications device 502, an airborne or space borne communications device 504, and a computing system 506 are examples of the electronic systems 500 using memory arrays in accordance with the various embodiments of the invention. In particular, the electronic system 500 may be any electronic devices or systems that perform any function for the creation, transportation, storage, and consumption of information. For example, the terrestrial communications device 502 may create information by transmitting data to the spaceborne communications device 504. The communications device 504 can then transport the information to the computing system 506. The computing system 506 may be used to store the information. The terrestrial communications device 502 may also consume information sent from the spaceborne communications device 504.

Although the invention has been illustrated and described with respect to one or more implementations, equivalent alterations and modifications will occur to others having ordinary skill in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An electronic device, comprising:
a substrate having a semiconducting surface, said semiconducting surface comprising a plurality of fin-type projections with an inverted T-shaped cross-section comprising a proximal base portion and a distal extension portion;
a plurality of dielectric layers disposed on said distal extension portion of said plurality of fin-type projections;
a plurality of dielectric isolation features arranged between said plurality of fin-type projections and extending over sidewall portions of said proximal base portion and having a height being greater than a height of said proximal base portion of said plurality of fin-type projections, wherein a portion of said plurality of dielectric layers substantially fill a region that extends between a portion of a sidewall of said distal extension portion of said plurality of fin-type projections and a sidewall of said plurality of dielectric isolation features and that extends between said height of said proximal base portion and said height of said plurality of dielectric isolation features; and
a plurality of control gate layers disposed on said plurality of dielectric isolation features and other portions of said plurality of dielectric layers.

2. The electronic device of claim 1, wherein a difference between said height of said dielectric isolation features and said height of said proximal base portion in said plurality of fin-type projections is at least 100 angstroms.

3. The electronic device of claim 1, wherein a difference between said height of said dielectric isolation features and said height of said proximal base portion in said plurality of fin-type projections is at most 1000 angstroms.

4. The electronic device of claim 1, wherein an average thickness of said portion of said plurality of dielectric layers is greater than an average thickness of said other portions of said plurality of dielectric layers.

5. The electronic device of claim 1, wherein said plurality of control gate layers comprise a plurality of coextending lines, and further comprising:
a control element communicatively coupled to said plurality of coextending lines and said plurality of active areas to provide a memory system; and
an electronic device communicatively coupled to said memory system.

6. An integrated circuit, comprising:
a substrate having a silicon surface, said silicon surface comprising a first plurality of fin-type projections with an inverted T-shaped cross-section comprising a proximal base portion and a distal extension portion;
a plurality of dielectric layers disposed on said distal extension portion of said plurality of fin-type projections;

a plurality of dielectric isolation features arranged between said first plurality of fin-type projections and extending over sidewall portions of said proximal base portion and having a height being greater than a height of said proximal base portion of said first plurality of fin-type projections, wherein a portion of said plurality of dielectric layers substantially fill a region that extends between a portion of a sidewall of said distal extension portion of said plurality of fin-type projections and a sidewall of said plurality of dielectric isolation features and that extends between said height of said proximal base portion and said height of said plurality of dielectric isolation features; and a plurality of control gate layers disposed on said plurality of dielectric isolation features and other portions of said plurality of dielectric layers.

7. The integrated circuit of claim 6, wherein a difference between said height of said dielectric isolation features and said height of said proximal base portion in said first plurality of fin-type projections is at least 100 angstroms.

8. The integrated circuit of claim 6, wherein a difference between said height of said dielectric isolation features and said height of said proximal base portion in said first plurality of fin-type projections is at most 1000 angstroms.

9. The integrated circuit of claim 6, wherein an average thickness of said portion of said plurality of dielectric layers is greater than an average thickness of said other portions of said plurality of dielectric layers.

10. The integrated circuit of claim 6, further comprising a second plurality of fin-type projections defining a control element portion, wherein said plurality of control gate layers comprises a plurality of lines, and wherein said control element is communicatively coupled to said plurality of lines and said first plurality of fin-type projections to provide a memory system.

* * * * *